United States Patent [19]
Lampe et al.

[11] Patent Number: 4,841,480
[45] Date of Patent: Jun. 20, 1989

[54] CROSS-TIE MEMORY SYSTEM

[75] Inventors: Donald R. Lampe, Ellicott City, Md.; Mark A. Mentzer, Lititz, Pa.; Eric H. Naviasky, Baltimore, Md.

[73] Assignee: Westinghouse Electric Corp., Pittsburgh, Pa.

[21] Appl. No.: 107,122

[22] Filed: Oct. 9, 1987

Related U.S. Application Data

[63] Continuation-in-part of Ser. No. 795,284, Nov. 5, 1985, Pat. No. 4,722,073.

[51] Int. Cl.$^4$ .............................................. G11C 19/08
[52] U.S. Cl. ..................................... 365/87; 365/158
[58] Field of Search .............................. 365/87, 158

[56] References Cited

U.S. PATENT DOCUMENTS

| | | | |
|---|---|---|---|
| Re. 30,087 | 8/1979 | White et al. ........................ 307/304 |
| 3,868,660 | 2/1975 | Schwee ............................... 365/171 |
| 3,997,885 | 12/1976 | Battarel ................................ 365/87 |
| 4,035,629 | 7/1977 | Lampe et al. ..................... 235/193 |
| 4,473,893 | 9/1984 | Zierhut et al. ........................ 365/87 |

Primary Examiner—James W. Moffitt
Attorney, Agent, or Firm—W. G. Sutcliff

[57] ABSTRACT

Double complementary storage is provided for a single binary digit in a quad store cross-tie memory. A correlated double sampling signal processing system is used to increase data signal level and facilitate discrimination in cross-tie memories. A method is also provided for accomplishing write and read functions in a quad store cross-tie memory using only a single pulse for either function. A set of four memory elements, arranged in two row-aligned complementary pairs, stores a single data bit, and is under four column conductors for reading data, two row conductors, and a write conductor for writing data.

17 Claims, 7 Drawing Sheets

CROSS-TIE MEMORY SYSTEM

RELATED APPLICATION

This application is a continuation-in-part of U.S. Ser. No. 795,284, filed Nov. 5, 1985, now U.S. Pat. No. 4,722,073, entitled "Magnetoresistive Random Access Memory Architecture and Signal Processing System."

FIELD OF THE INVENTION

The present invention relates to the field of storage of digital data using magnetic media, and in particular to a random access memory (RAM) device that stores digital data as the presence or absence of a cross-tie wall paired with a Bloch-line in memory elements in a thin magnetic film.

BACKGROUND OF THE INVENTION

Within a small region, or domain, of a thin film of magnetic material, the dipole magnetic moments of neighboring atoms align themselves when placed in an external magnetic field. This alignment of dipole moments is unique to magnetic materials such as Fe, Co, Ni, Gd, and Dy. Despite the random motion undergone by atoms within any material, this magnetic orientation of the atoms in a magnetic material remains even after the externally applied magnetic field is removed.

A transition region exists between adjacent domains of a magnetic material in which the magnetic dipoles have a different direction of alignment. The transition region between two domains with differing alignments is referred to as a domain wall. There are three types of domain walls, each of which is three types of domain walls, each of which is distinguishable from the others in that the magnetic field within each type of domain wall is oriented in a unique way. Within a Neel wall, the transition between the adjacent domains is evidenced by a wall in which the magnetic field rotates within the plane of the thin magnetic film. In a Bloch wall, the magnetic field rotates out of the plane of the magnetic film. The cross-tie wall is the third type of domain wall and reverses the direction of the magnetic field in a small portion of a Neel wall. The cross-tie wall is located between two sections of a Neel wall that have magnetic fields pointing in opposite directions. The section of the Neel wall in which the magnetic field is inverted is bordered by the cross-tie wall on one end and by a Bloch wall or Bloch-line (in a very thin film) on its other end.

In the absence of an external magnetic field of a predetermined strength, the characteristic magnetic field associated with each of the three different types of domain walls will remain unchanged. An external magnetic field of predetermined strength is used to change the magnetic state of a domain wall. These stable domain wall magnetization fields, referred to as domain states, can be utilized for the storage of data in a random access memory system. The resulting device is referred to as a cross-tie memory system. Cross-tie random access memory technology offers the following desirable characteristics: non-volatility, non-destructive read-out, radiation hardness, high density, and a large temperature operating range.

In a cross-tie memory system, there are two stable domain states that are established by application of appropriate magnetic fields to the memory elements in order to store digital data. The domain states are changed by changing non-inverted Neel walls in memory elements to inverted Neel walls and vice-versa, in which an inverted Neel wall is bounded by a cross-tie wall and a Bloch-line. Within a memory element, a Neel wall will separate two large magnetic domains in which the magnetic moments are aligned in exactly opposite directions. On the other hand, creation of an inverted Neel wall within the memory element occurs when the direction of the magnetic moments in the surrounding magnetic domains is altered.

U.S. Pat. No. 4,231,107 teaches the significance of the shaping of a thin film of Permalloy magnetic material used to form the memory element, with spaced serrated edges being provided in the strips of magnetic material to give the cross-ties and Bloch-lines preferred locations.

Magnetoresistance is a change in electrical resistance to a flow of current through a memory element due to the application of a magnetic field to the memory element. Read-out of data from a cross-tie memory system is accomplished by the use of magnetoresistive effects. Current is applied to a conductor overlying a memory element and introduces a small magnetic field into the magnetic domains of the memory element. The change in resistance which takes place within the memory element with the application of the small magnetic field is a function of the domain state present in the memory element. Writing of data into the memory element requires the application of a larger magnetic field by means of currents applied to conductors overlying the memory element, and results in the generation of a cross-tie, Bloch-line pair bounding an inverted Neel wall, or the annihilation of a cross-tie, Bloch-line pair.

The read-out of digital data from such cross-tie random access memories utilizes the magnetoresistive effects described above, in which a change in resistance to current flowing through the memory element is produced by applying a magnetic field to the memory element. The amplitude of this change in resistance is a function of whether the memory element is in a state including a non-inverted Neel wall, or a state including an inverted Neel wall with a cross-tie, Bloch-line pair, which are the two stable states used to store binary data.

U.S. Pat. No. 4,473,893 teaches a cross-tie random access memory system with an X-Y array of discrete memory elements 14 formed of conductive striplines 18 of serrated Permalloy film, having aligned rows of conductors 28 overlying the discrete memory elements in the X rows, and serpentine-shaped column-forming conductive striplines 30 aligned with the X row conductors over the individual memory elements of the X-Y memory array. In this cross-tie memory, the digital data is written into memory elements 14 using small amplitude signals applied to both the row and zig-zag conductors. This system includes a row of reference memory elements 16 which are utilized during the read-out operation, with a differential read-out being had between memory elements 14 containing the stored digital data and reference memory elements 16. Each memory element 14 stores a single bit of data. FIGS. 4 and 7 show the voltage or current pulses that are applied during the writing and reading, respectively, of a data bit into a memory element.

The modulation in magnetoresistance produced during memory read-out of a memory element in cross-tie random access memories gives rise to extremely small signals. Due to the small size of the regions containing the domain walls, the resistance changes are minute.

The data signals are therefore difficult to detect, especially in the presence of substantial temporal noise. Additional detection problems are caused by offset signals which arise when matching various memory system components, and read problems caused by non-uniform noise.

Re. Pat. No. 30,087, owned by the assignee of the present invention, teaches a coherent sampled CMOS read-out circuit and signal processor coupled to a CCD shift register operated by a two-phase minority carrier transfer clock system. The signal processing taught in this reference is also termed correlated double sampling, which enhances the signal-to-noise ratio of the output signal for the CCD devices. In U.S. Pat. No. 4,035,629, owned by the assignee of the present invention, a correlated double sampling technique is utilized for processing output signals from charge transfer devices. Using this technique, a data signal and a reference level signal are differenced in at least two stages of a read sequence, thereby increasing the probability that the resultant output signal will be correct by reducing the effects of both temporal noise and spatial (due to offset signals) noise. However, neither of these disclosures teaches how correlated double sampling can be applied to a cross-tie random access memory. Furthermore, in some cases it may be desirable to obtain a faster read-out of a single binary digit stored in several memory elements than is achieved when reading in several stages during a read sequence or when reading each memory element one at a time.

SUMMARY OF THE INVENTION

It is an object of the invention to obtain the advantages of cross-tie random access memory technology while reducing data detection and discrimination problems caused by offset signals, temporal noise, and non-uniform noise.

It is an object of one embodiment of the present invention to provide for double complementary storage of a single binary digit in a set of four memory elements, referred to as a quad store cross-tie memory, which increases the data signal level and eliminates the need for reference memory elements.

It is an object of another embodiment of the invention to use correlated double sampling in a cross-tie memory system to increase the data signal level and to facilitate discrimination between the two binary logic levels It is an object of an additional embodiment of the present invention to provide a method of accomplishing write and read functions in a quad store cross-tie memory using only a single pulse for either function. The advantages of this method include reduced cycle time and improved reliability for the cross-tie memory.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the foregoing objects, and in accordance with the purposes of the invention as embodied and broadly described herein, there is provided a cross-tie random access memory, in which a single bit of data is stored in a memory element by alternately generating and annihilating a cross-tie, Bloch-line pair in the memory element, comprising: a plurality of column conductors, each column conductor including a plurality of memory elements and a tap point; a plurality of row conductors, each row conductor overlying a plurality of memory elements; column address means for applying a column current in two different directions at different times to a selected column conductor including a selected memory element, for generating a tap voltage at the tap point of the selected column conductor that is related to the magnetoresistance of the selected memory element; data signal means coupled to the tap point of the selected column conductor for generating a data signal voltage related to the tap voltage at times when the column current is applied to the selected column conductor; row address means for applying a row current to a selected row conductor overlying the selected memory element for applying a magnetic field to the selected memory element; offset means coupled to the data signal means for storing a first data signal voltage present at a time when the column current is applied and the row current is not applied, and for comparing the first data signal voltage with a second data signal voltage present at a subsequent time when both the column current and row current are applied, to generate a difference voltage related to the difference between the first and second data signal voltages; double sampling means coupled to the offset means for storing a first difference voltage present at a time when the column current is applied in one direction, and for comparing the first difference voltage with a second difference voltage present at a subsequent time when the column current is applied in the other direction, to generate an output voltage related to the difference between the first and second difference voltages; and output means coupled to the double sampling means, and responsive to the output voltage, for generating a digital output corresponding to the data bit stored in the selected memory element.

In order to obtain additional objects of the invention, a cross-tie random access memory is provided in which a single bit of data is stored in a set of four memory elements, including a first row-aligned pair of memory elements and a complementary second row-aligned pair of memory elements, comprising: four column conductors, each including a plurality of column-aligned memory elements and a tap point, and each including one of the four memory elements; a first and second row conductor, each overlying a plurality of row-aligned memory elements, and respectively overlying the first and second row-aligned pairs of memory elements; a write conductor overlying a plurality of memory elements, and including a first and a second portion respectively overlying the first and second row-aligned pairs of memory elements, to which a write current is applied at times when the bit of data is written, for generating a cross-tie, Bloch-line pair in one row-aligned pair of memory elements and annihilating a cross-tie, Bloch-line in the other row-aligned pair of memory elements; row address means for applying a first row current to the first row conductor and a second row current to the second row conductor at times when the bit of data is read and at times when the bit of data is written, for applying a magnetic field to the first and second row-aligned pairs of memory elements; column address means for applying the write current to the first and second portions of the write conductor at times when the bit of data is written to apply a magnetic field to the first and second row-aligned pairs of memory elements, and for applying a read current to each of the four column conductors at times when the bit of data is read to generate a tap voltage at the tap point of each of the four column conductors that is related to the magnetoresistance of each of the four memory elements; and data signal means coupled to the tap points of the four column conductors for generating a data signal voltage related to the tap voltages at times when the read current is applied that corresponds to the data bit stored in the four memory elements.

Further objects of the invention can be realized by using a method for reading data out from a cross-tie random access memory, in which four memory elements used to store a single bit of data are each included in one of four column conductors, the four memory elements including a first row-aligned pair included in a first and fourth column conductor and underlying a first row conductor, and a complementary second row-aligned pair included in a second and third column conductor and underlying a second row conductor, in which each column conductor includes a tap point, the method comprising the steps of: applying a single current pulse to the first and the second row conductor in the same direction, to apply substantially the same magnetic field to each of the four memory elements; applying a single current pulse to the four column conductors, to generate a tap voltage at the tap point of each of the four column conductors that is related to the magnetoresistance of each of the four memory elements; wherein the tap voltages for the first and second column conductors increase at times when the four memory elements are storing a data bit at one level and decrease at times when the four memory elements are storing a data bit at another level, and the tap voltages for the third and fourth column conductors decrease at times when the four memory elements are storing a data bit at the one level and increase at times when the four memory elements are storing a data bit at the other level; inputting the tap voltages for the first and second column conductors to a first input of a differential amplifier; inputting the tap voltages for the third and fourth column conductors to a second input of the differential amplifier; and reading out the level of the data bit stored in the four memory elements in accordance with a voltage output generated by the differential amplifier.

The accompanying drawings, which are incorporated in and constitute a part of the specification, illustrate an embodiment of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings.

Figure 1:
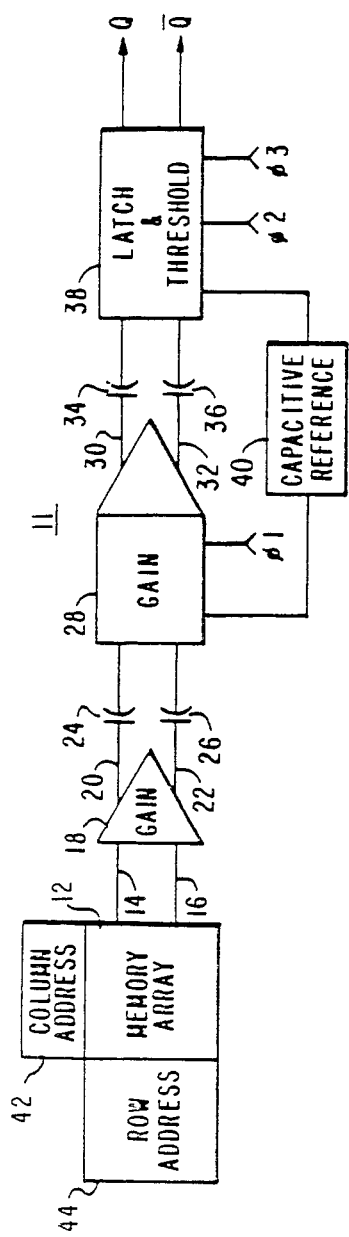
FIG. 1 is a schematic block diagram of a cross-tie random access memory system that utilizes correlated double sampling.

A magnetoresistive random access memory array architecture and signal processing system is illustrated in FIG. 1, in which a memory array 12 is coupled to a signal processing system 11, which in one embodiment is a full differential correlated double sampling system. Column address means 42 and row address means 44 are coupled to memory array 12. Memory array 12 is coupled over differential output lines 14 and 16 to a first gain amplifier 18, the differential outputs of which are respectively coupled over lines 20 and 22 to equal-valued capacitors 24 and 26, and thereafter coupled to a second gain amplifier 28. The differential outputs of second gain amplifier 28 are respectively coupled along lines 30 and 32 to a second matched pair of capacitors 34 and 36, which are in turn coupled to a latch and threshold means 38. The logic levels Q and $\overline{Q}$ represent the digital output and its logical inverse corresponding to a data bit stored in a selected memory element in the memory array. A capacitive reference means 40 is coupled to second gain amplifier 2S and to latch and threshold means 38. A $\phi 1$ switch and pulse means is coupled to second gain amplifier 28, and a $\phi 2$ and $\phi 3$ switch and pulse means are coupled to latch and threshold means 38.

Figure 2:
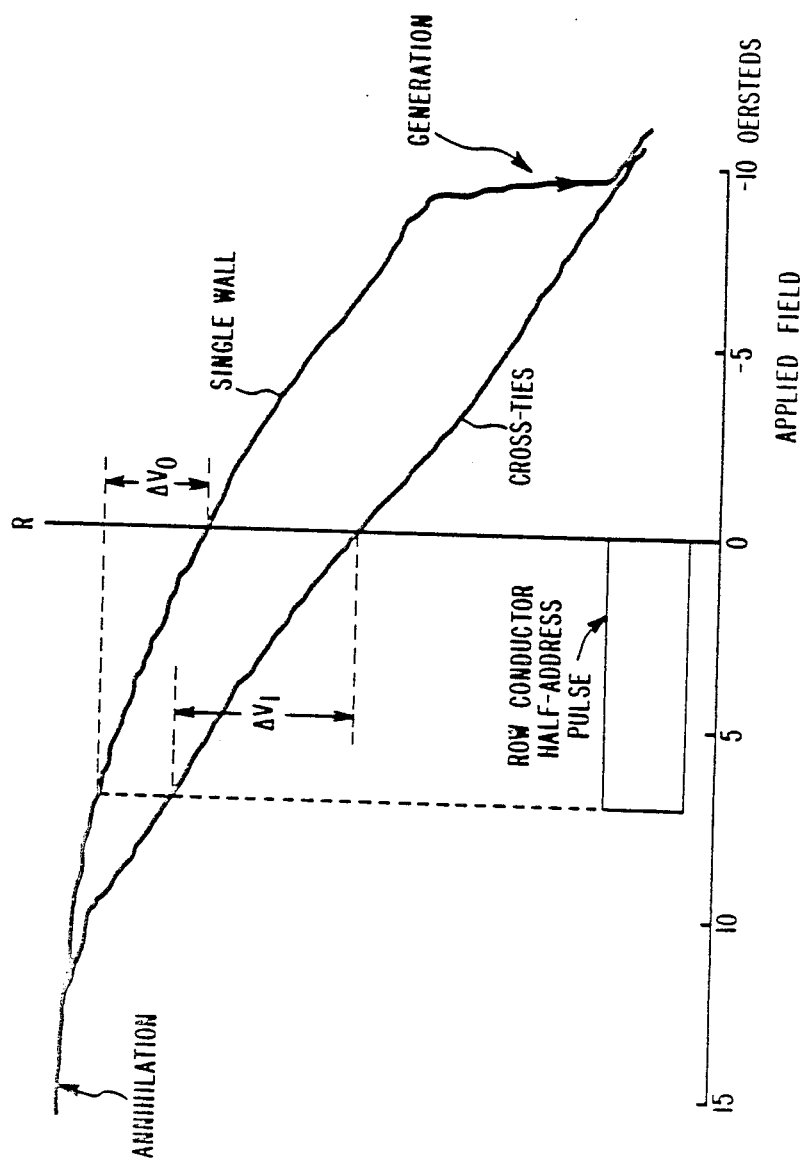
FIG. 2 is a plot of resistance versus magnetic field strength for a cross-tie memory element, illustrating the different magnetoresistive responses in the non-inverted Neel wall state and the cross-tie wall state.

FIG. 2 illustrates basic magnetoresistive effects in thin film Permalloy memory elements. The resistance change in a memory element is a function of the magnetic field applied to the memory element by a small amplitude voltage or current pulse flowing in a row conductor overlying the magnetic memory element. In FIG. 2, the top curve illustrates the change in resistance in a memory element as a function of the applied field when the element contains a non-inverted Neel wall. The resultant change in $V_0$ is the change observed in potential drop across that memory element when a current is applied to an overlying row conductor. The lower curve illustrates the resistance characteristics for the same memory element when it contains a cross-tie, Bloch-line pair, wherein the change in $V_1$ is seen to be larger than the change in $V_0$ observed in the absence of a cross-tie, Bloch-line pair. The curves form an RH (resistance-magnetic field) loop which is symmetrical, but other magnetoresistive materials can be utilized which exhibit an asymmetrical RH loop.

Figure 4:
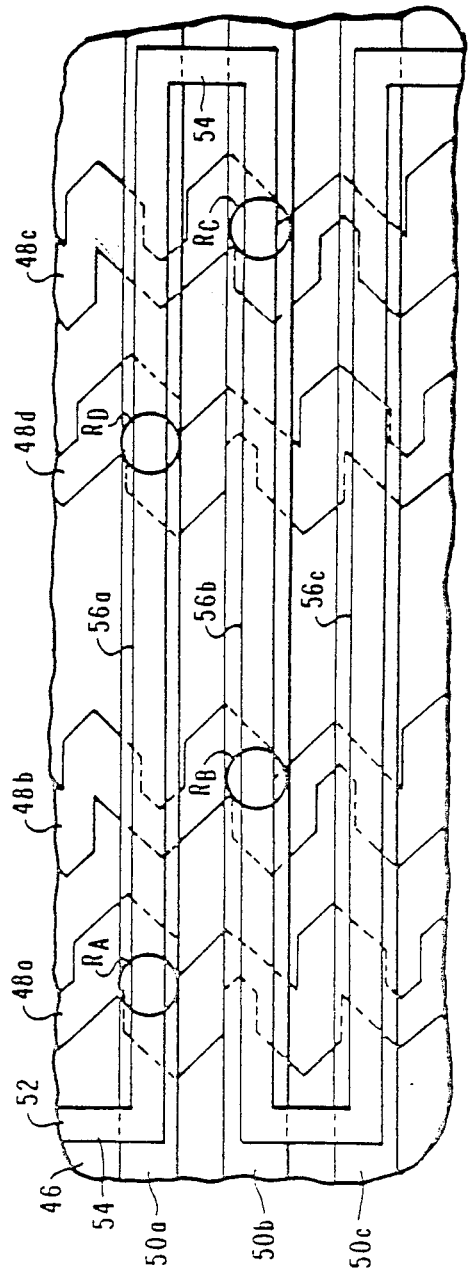
FIG. 4 is a planar view of a portion of a cross-tie random access memory.

The basic memory element arrangement of FIG. 4, which provides for storage of a single binary digit, is a quad of magnetic memory elements $R_A$, $R_B$, $R_C$, and $R_D$, which are arranged and addressed in double complementary fashion. Thus, a set of four memory elements is used to read and write one bit of data.

In accordance with one aspect of the invention, a cross-tie random access memory is provided in which a single bit of data is stored in a set of four memory elements. A cross-tie, Bloch-line pair is alternately generated and annihilated in a first row-aligned pair of memory elements, while at the same time in a second row-aligned pair of memory elements that is complementary to the first pair, a cross-tie, Bloch-line pair is alternately annihilated and generated.

As embodied herein, the structure of cross-tie memory array 12 with double complementary memory elements can be understood by reference to FIG. 4, wherein an insulating substrate 46 has disposed thereon a plurality of spaced columns of thin film magnetized Permalloy material, such as column conductors 48A, 48B. 48C and 48D. The edges of the thin columns of Permalloy material are serrated as is known in the art to include a plurality of column-aligned memory elements. An X-Y array pattern of memory elements, including the set of four memory elements $R_A$, $R_B$, $R_C$, and $R_D$ in FIG. 4, are formed on the surface of substrate 46.

In accordance with this aspect of the invention, the four column conductors each include a plurality of column-aligned memory elements, including one of the set of four memory elements. The total number of memory elements in the X-Y array can be widely varied depending upon the total number of columns of Permalloy and the length of each column. In the embodiment seen in FIG. 4, only a single set of four memory elements arranged in two rows and four columns for storing a single bit of data is illustrated for purposes of understanding the basic array pattern and function.

In accordance with this one embodiment of the invention, a first and second row conductor are provided, each overlying a plurality of row-aligned memory elements, and respectively overlying a first and a second row-aligned pair of the set of four memory elements. Each of row conductors 50A and 50B in FIG. 4 is superimposed over a corresponding row-aligned pair of memory elements included in different columns. For example, row conductor 50A is aligned over memory elements $R_A$ and $R_D$.

The invention includes a write conductor overlying a plurality of memory elements, and including a first and second portion respectively overlying the first and second row-aligned pairs of memory elements, to which a write current is applied at times hen a bit of data is written, for generating a cross-tie, Bloch-line pair in one of the two row-aligned pairs of memory elements while anniliating a cross-tie, Bloch-line pair in the other row-aligned pair. The write conductor can be arranged in a manner so that a write current applied to the conductor flows through the first portion in one direction and flows through the second portion in the other direction. As a result, different magnetic fields are applied by the write current to each of the row-aligned pairs of memory elements.

As embodied herein, a write conductor 52, or zig-zag conductor, has sections 54 extending in the same vertical direction as the Permalloy columns, which interconnect portions 56A, 56B, and 56C, which are horizontal portions of the write conductor that are aligned with the row conductors. First portion 56A of the write conductor is aligned with first row conductor 50A and overlies the first row-aligned pair of memory elements $R_A$ and $R_D$. The shape of write conductor 52 is serpentine to ensure that current flowing in first portion 56A of the ziz-zag conductor aligned with first row conductor 50A will flow in a first direction, whereas current will flow in a second direction opposite the first direction in portion 56B of the write conductor aligned with second row conductor 50B. The current flowing in write conductor portion 56A overlying the row-aligned pair of memory elements $R_A$ and $R_D$, for example, can travel from left to right as viewed in FIG. 4, at times when the current in write conductor portion 56B aligned with second row conductor 50B and overlying the row-aligned pair of memory elements $R_B$ and $R_C$ is flowing from right to left.

Figure 5:
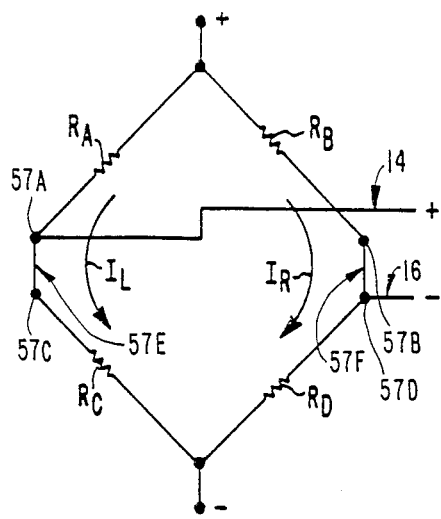
FIG. 5 is a schematic of the bridge configuration of double complementary memory elements used to store a single binary digit.
Figure 6:
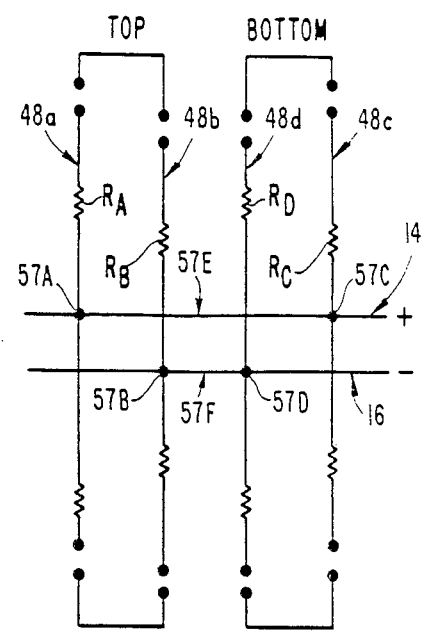
FIG. 6 is the schematic of FIG. 5 rearranged to represent the four memory elements (which constitute the bridge resistors) as they are spatially disposed in the embodiment of FIG. 4.

In accordance with the invention, each of the column conductors includes a tap point. As embodied in this aspect, at times when a data bit is read by applying a read current to the four column conductors, a tap voltage is generated at the tap point for each column conductor that is related to the magnetoresistance of the corresponding memory element included in that column conductor. In one preferred embodiment, first and second connecting conductors 57E and 57F (FIGS. 5, 6, 7) each couple together the tap points of two column conductors 48, with each pair of coupled column conductors 48 including two memory elements that are not row-aligned. Connecting conductors 57E and 57F provide the tap voltages as inputs to differential amplifier 18, and are respectively connected to the first and second inputs of the amplifier via lines 14 and 16. The bridge circuits shown in FIGS. 5 and 6 illustrate a classic bridge configuration in which the read current and the magnetoresistance of the memory elements, in accordance with Ohm's law, determine the tap voltages at the tap points that are used as inputs to differential amplifier 18. FIG. 6 is a rearranged bridge circuit corresponding to FIG. 5 which represents the actual spatial position of the set of four memory elements in FIG. 4 functioning as four bridge resistors. The memory element lay-out is designed to keep all four memory elements in close proximity to minimize noise due to spatial non-uniformities.

The invention includes data signal means coupled to the tap points of the column conductors for generating a data signal voltage at times when a read current is applied to the column conductors. The data signal voltage is related to the tap voltages and corresponds to the data bit stored in the memory elements.

As embodied herein, the data signal means can include first gain amplifier 18. As shown in FIGS. 1, 5 and 6, the non-inverting input line 14 to the differential amplifier is coupled to tap points 57A and 57C, and the inverting input line 16 is coupled to tap points 57B and 57D. The data signal voltage output by amplifier 18 on lines 20 and 22 depends on which row-aligned pair of memory elements contains a cross-tie, Bloch-line pair.

This same facet of the invention includes column address means for applying a write current to the first and second portions of the write conductor at times when a data bit is written to apply a magnetic field to the first and second row-aligned pairs of memory elements. The preferred embodiment for writing of non-inverted Neel walls and cross-tie, Bloch-line pairs into a double complementary distribution of four closely spaced memory elements in a correlated double sampling system can be understood by reference to the write operation signals illustrated in FIG. 3A. In order to write one bit of data into the set of four memory cells shown in FIG. 4, write conductor 52 is selected by column address means 42. In the preferred embodiment, a write current flows (e.g., from top to bottom) through sections 54 of conductor 52, causing a small amplitude current to flow (e.g., from left to right) through portion 56A aligned with row conductor 50A, and (e.g., from right to left) through portion 56B aligned with row conductor 50B.

Figure 3A:
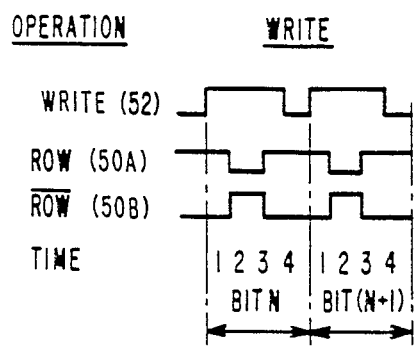
FIG. 3A is a timing diagram of the write signals applied to the memory array for the cross-tie random access memory of FIG. 1.

This one aspect of the invention includes row address means for applying a first row current to the first row conductor and a second row current to the second row conductor at times when the bit of data is read and at times when the bit of data is written, for applying a magnetic field to the first and second row-aligned pairs of memory elements. As embodied herein, row conductors 50A and 50B are selected by row address means 44, and are addressed during a write operation with complementary current pulses, as shown in FIG. 3A. Current in row conductor 50A flows, e.g., from left to right, and flows in 50B, e.g., from right to left. The row currents applied to row conductors 50A and 50B, similar to the write current applied to write conductor 52, are small in amplitude. However, the combination of two currents in the same direction in two conductors overlying the same row-aligned pair applies two magnetic fields of sufficient combined strength to simultaneously generate or annihilate a cross-tie, Bloch-line pair in each of the four memory elements $R_A$, $R_B$, $R_C$, and $R_D$.

Writing occurs by generating cross-tie, Bloch-line pairs in one row-aligned pair of memory elements, and annihilating such pairs in the other row-aligned pair. Thus, writing a single bit requires simultaneous writing of all four memory elements in double complementary form. Both memory elements underlying first row conductor 50A are set in the same state in the example above, which is opposite to the state of the complementary second row-aligned pair of memory elements underlying adjacent second row conductor 50B. For example, cross-tie, Bloch-line pairs may have been written in first row-aligned pair $R_A$ and $R_D$, whereas second row-aligned pair $R_B$ and $R_C$ is set to contain non-inverted Neel walls. By reversing the direction of the write current and the first and second row currents, the magnetic fields applied to the memory elements change sign (see FIG. 2), and each one of the four elements is written with the opposite domain state, changing the value of the stored data bit.

In contrast, for other memory elements in different rows, the magnetic field generated by the small amplitude current in write conductor 52 is only fractionally that which is needed to create or annihilate cross-tie, Bloch-line pairs. See FIG. 2. Similarly, other elements underlying the first or second row conductors, but not under a portion of a write conductor to which a write current is applied, are not subjected to a sufficient magnetic field to change state. Therefore, no change of state occurs during writing at memory elements that are not addressed by both the column and row address means.

In accordance with this embodiment of the invention, the column address means applies a read current to each of the four column conductors at times when a data bit is read to generate a tap voltage at the tap point of each of the four column conductors that is related to the magnetoresistance of each of the four memory elements. As embodied herein, during the read operation, current pulses in selected Permalloy column conductors 48 pass through the selected memory elements. The first and second row currents applied to conductors 50A and 50B apply a magnetic field that changes the resistance of the underlying current-carrying row-aligned memory elements. (See FIG. 2) A relatively small resistance change is seen for memory elements in a row-aligned pair which do not contain cross-tie, Bloch-line pairs, and a somewhat larger change in resistance occurs for memory elements in a complementary row-aligned pair in which cross-tie, Bloch-line pairs exist. As shown in FIG. 2, the smaller resistance change gives rise to a smaller potential drop change ($V_0$), whereas the larger resistance change gives rise to a larger change in voltage across the memory element ($V_1$).

Figure 3B:
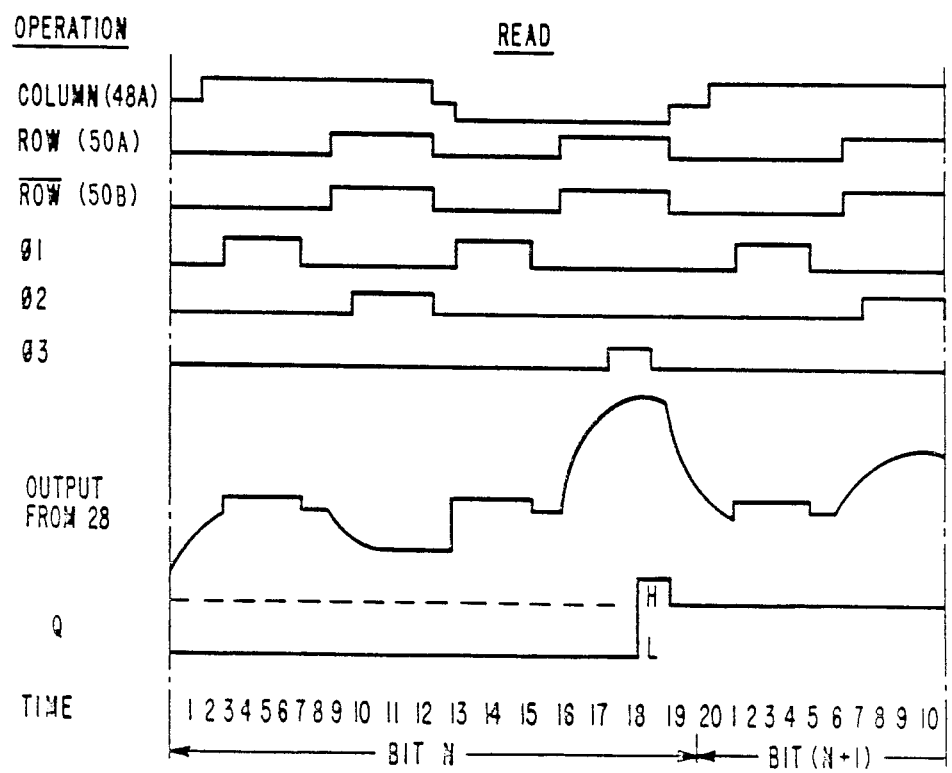
FIG. 3B is a timing diagram of the read signals applied to the memory array for the cross-tie random access memory of FIG. 1.

One preferred type of read-out sequence from memory array 12 in signal processing system 11 utilized in another embodiment of the invention can be understood by reference to FIGS. 1 and 3B. In this embodiment, signal processing system 11 utilizes correlated double sampling to differentially remove most of the fixed pattern non-uniformity noise. Correlated double sampling not only cancels offset signals resulting from fixed pattern non-uniformities, but, because of the correlation of low frequency noise, substantially reduces those adverse effects as well. The differencing action of correlated double sampling, due to voltages clamped on capacitors 34 and 36 by action of the $\phi 2$ switch and pulse means, doubles the signal amplitude and virtually eliminates any array or circuit offset non-uniformities, while increasing the temporal noise by only a small factor. The waveforms of FIG. 3B define this read-out sequence.

During the read operation, a nominal current pulse is applied to selected column conductors 48 by column address means 42, and a current pulse is applied to selected row conductors 50 by row address means 44, to define the set of memory elements being read. The row current applied to the row conductors is of small amplitude, only about half that required for creation or annihilation of a cross-tie, Bloch-line pair, and is not large enough to change any domain state from a cross-tie, Bloch-line pair state to a non-inverted Neel wall state, or vice-versa.

In accordance with this other aspect of the invention, offset means may be provided and is coupled to the data signal means for storing a first data signal voltage present at a time when the column current is applied and the row current is not applied, and for comparing the first data signal voltage with a second data signal voltage present at a subsequent time when both the column current and row current are applied, to generate a difference voltage related to the difference between the first and second data signal voltages. In actual amplifiers, an unbalance is caused by mismatch of the input components, which results in unequal bias currents or voltages at the amplifier inputs. The offset voltage is the difference between the voltages present at the two output terminals of differential amplifier 18 when the two input voltages should be equal because no current is being applied to row conductors 50. In the preferred embodiment, in response to a read command, current pulses are applied to four selected Permalloy column conductors 48 to first measure the magnetoresistance of the memory elements in the absence of any applied magnetic field. The other columns 48 are left disconnected (floating) by keeping their respective column select switches in a high impedance state. The resultant read-out bias is clamped, after amplification in first gain amplifier 18, as an offset voltage on capacitors 24 and 26 by action of the $\phi 1$ switch and pulse means. The offset error can be exactly nulled by activating the $\phi 1$ switch and pulse means to store a first data signal voltage on capacitors 24 and 26 exactly equal to and cancelling the error. After the φ1 switch is opened (deactivated), a small amplitude current pulse is applied by the row address means to row conductors 50A and 50B to generate a second data signal voltage. When the signal from second gain stage 28 stops slewing and reaches equilibrium, the φ2 switch and pulse means is activated to store on capacitors 34 and 36 a voltage equal and opposite to the output of second gain means 28. When the signal has settled from any magnetic perturbation due to currents in the row conductors, the second data signal voltage due to the magnetic field applied to the memory elements by the row currents is directly subtracted from the stored offset voltage that was the first gain block output, to generate a first difference voltage.

This other embodiment of the invention may include double sampling means coupled to the offset means for storing a first difference voltage present at a time when the column current and the row current are applied in one direction, and for comparing the first difference voltage with a second difference voltage present at a subsequent time when the column current is applied in the other direction, to generate an output voltage related to the difference between the first and second difference voltages. In this preferred embodiment, the read-out sequence for correlated double sampling continues by removing the small amplitude current applied to the pair of row conductors 50A and 50B, and by reversing the current applied by column address means 42 to selected Permalloy column conductors 48. The read current applied to the memory elements is reversed, so the resultant offset error is likely to change. Thus, the new offset voltage must be subtracted by again activating the φ1 switch and pulse means. The voltage offset associated with the reversed versed read current is stored on capacitors 24 and 26.

Next, a small amplitude current pulse is applied to row conductors 50A and 50B to generate a magnetic field, thereby resulting in a second difference voltage. Because the current in column conductors 48 is reversed, essentially reversing the sensing drive on the bridge, the resultant magnetoresistive signal changes sign. Since the previous peak value for row conductors 50A and 50B had been clamped on capacitors 34 and 36 in a negative sense as a first difference voltage, the resultant voltage applied to the input of a comparator included in latch and threshold means 38 is the difference between the two peak values (i.e., the first and second difference voltages).

The read-out sequence is always the same. Thus, for example, if the other binary state had originally been stored at memory elements $R_A$, $R_B$, $R_C$, and $R_D$, the resulting sequence appearing in FIG. 3B would have the two halves interchanged. Hence, first a positive difference voltage is clamped on capacitors 34 and 36 when the φ2 switch and pulse means is activated, and is subtracted from a subsequent negative difference voltage at a later time when the φ3 switch and pulse means is activated. The resultant variation in these difference voltages is negative, and is very easy to discriminate from the positive variation resulting when the first binary logic level is stored. Consequently, greatly enhanced discrimination results. This preferred read-out sequence, in which the reading of the four memory elements in one and then the other stored logic level effectively requires accumulation of eight distinct measurements of magnetoresistance to discriminate between the two logic states, gives an ultimate improvement in the signal-to-noise ratio of approximately 2.8 dB. This circuit arrangement (and the arrangement of FIG. 7) also discriminates against spurious signals because of the common-mode rejection ratio of differential amplifier 18 (or 75), and because of the balancing effect of the bridge circuit arrangement.

Clamp capacitors 24 and 26 are connected to the input of second gain amplifier 28 as well as to their respective reset switches. The time periods from the trailing edge of the first pulse of φ1 to the trailing edge of φ2, and from the trailing edge of the second pulse of φ1 to the trailing edge of φ3, are the same. Thus, the mismatch in the leakage-associated drift for the two capacitors 24 and 26, due to any mismatch between the nominally identical reset switches and differential input pair, is nearly the same during both time periods. Even though the signal component is reversed in the two time periods, the error component due to drift is the same for both time periods, facilitating its cancellation by serial subtraction when using the correlated double sampling technique.

Finally, this embodiment of the invention includes output means coupled to the double sampling means, and responsive to the output voltage, for generating a digital output corresponding to the data bit stored in the selected memory element. As embodied herein, latch and threshold means 38 may function as the output means.

Figure 7:
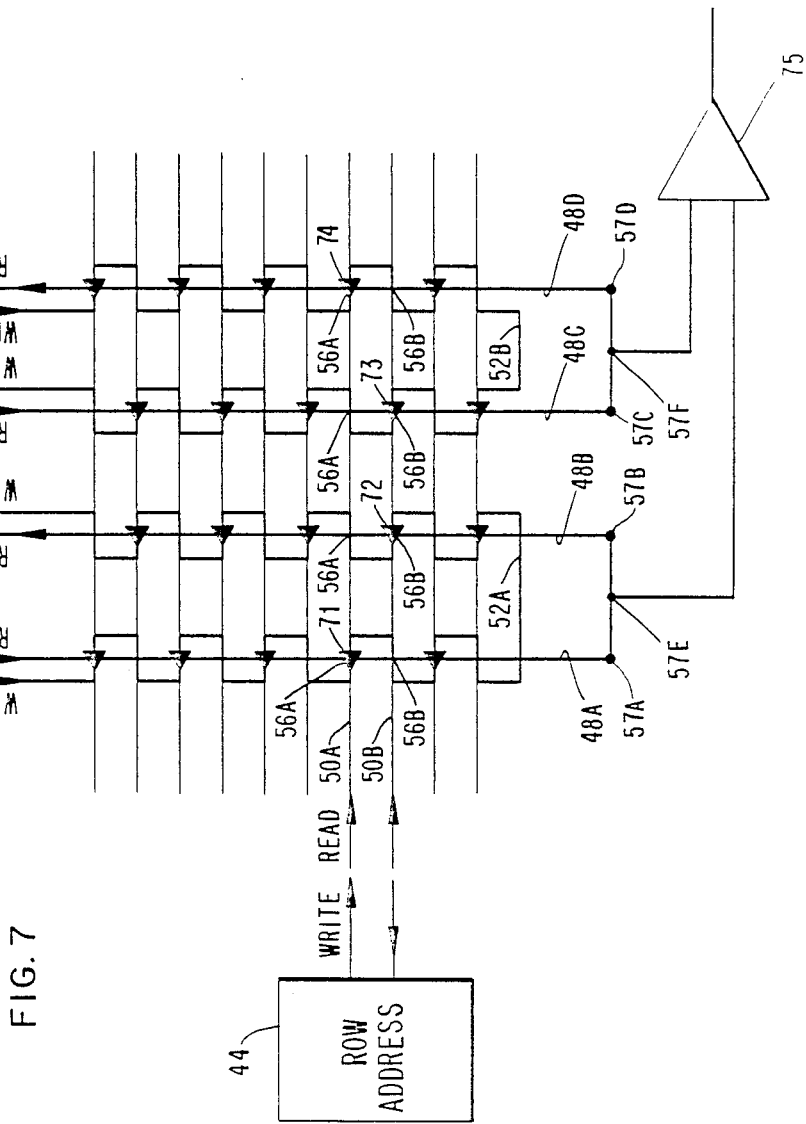
FIG. 7 is a schematic of a structure using a single pulse to accomplish read and write functions for a quad store cross-tie memory.

In accordance with still a further embodiment of the invention, FIG. 7 illustrates a structure for accomplishing read and write functions using only a single pulse for a quad store cross-tie memory. Four memory elements 71, 72, 73, and 74 are arranged in double complementary format and are used to store a single bit of data. These memory elements are arranged in two rows and four columns. Each memory element in the set is part of one of the column conductors 48A-D, which are formed of a thin film of magnetized Permalloy material. A first row conductor 50A overlies a first row-aligned pair of memory elements, e.g., elements 71 and 74, and a second row conductor 50B overlies the remaining two memory elements forming a complementary second row-aligned pair, e.g., elements 72 and 73. The exact ordering is not critical, compare FIG. 4, provided two memory elements are contained under each one of two adjacent row conductors 50A and 50B. A single write conductor 52 (FIG. 4), or a plurality of write conductors 52A and 52B (FIG. 7), is provided. The write conductor is preferably arranged in a manner that has portions aligned with first and second row conductors 50A and 50B such that an applied current is flowing in a first direction (e.g., left to right) in first portion 56A of write conductors 52A and 52B aligned with row conductor 50A, while a current flows in a second direction (e.g., right to left) in second portion 56B of write conductors 52A and 52B aligned with row conductor 50B.

In order to operate the memory array in this embodiment, there must be provided a means for applying a single current pulse to the four column conductors 48A-D, a means for applying a single current pulse to the first row conductor 50A and to the second row conductor 50B, and a means for applying a single current pulse to write conductor 52 or to a plurality of write conductors 52A and 52B. The manner of generating these current pulses is not critical, and the particular means employed are column address means 42 and row address means 44.

As embodied herein, a first connecting conductor 57E connects two column conductors 48 which contain two memory elements in different row-aligned pairs, e.g., columns 48A and 48B. Similarly, a second connecting conductor 57F connects column conductors 48C and 48D. Thus, tap points 57A and 57B are coupled together, as are tap points 57C and 57D. The first and second connecting conductors are respectively connected to the first and second inputs of a differential amplifier 75. As a result, the tap voltage at the tap points of column conductors 48A and 48B is equal and is alternately higher and lower than the tap voltage at the tap points of column conductors 48C and 48D, in accordance with the data bit stored in the four memory elements.

The preferred method for writing a single bit of data into the set of memory elements 71, 72, 73, and 74, without applying current pulses at least two different times during the write sequence, will now be described. A single small amplitude current pulse in one direction (e.g., left to right) is applied by row address means 44 to row conductor 50A to apply a first magnetic field to memory elements 71 and 74. At the same time, a single small amplitude current pulse in the other direction (e.g., from right to left), is applied to row conductor 50B to apply a second magnetic field to memory elements 72 and 73. A single small amplitude current pulse is also applied at that time to write conductor 52 to apply third and fourth magnetic fields, respectively, to the first and second row-aligned pairs of memory elements. This current pulse is applied by column address means 42 such that current flows in one direction (e.g., left to right) in first portion 56A of conductor 52 aligned with row conductor 50A, and in the other direction (e.g., right to left) in second portion 56B aligned with row conductor 50B.

The amplitude of the currents applied to the row conductors and write conductor is such that writing cannot occur if only the row conductor or the write conductor overlying a memory element is applying a magnetic field. However, as a result of the applying of two currents flowing in the same direction to an overlying row conductor (50A or 50B) and to an overlying write conductor portion (56A or 56B), a resultant magnetic field is generated that is sufficient to change the domain states in underlying memory elements 71, 72, 73, and 74. As shown in FIG. 2, an applied magnetic field in one direction generates a cross-tie, Bloch-line pair surrounding an inverted Neel wall, and a field of substantially the same strength in the opposite direction annihilates any cross-tie, Bloch-line pairs and results in a non-inverted Neel wall domain state. As an example, it can be assumed that the magnetic fields associated with currents flowing in a first direction in conductors overlying memory elements 71 and 74 generate cross-tie, Bloch-line pairs in the two memory elements, whereas currents flowing in a second direction generate magnetic fields that annihilate any cross-tie, Bloch-line pairs in the two memory elements 72 and 73.

In order to store data utilizing a double complementary structure for four memory elements, the resulting magnetic field applied to two memory elements in the same row must be in the same direction, which must be opposite in direction to the magnetic field applied to two memory elements in the adjacent row. As embodied herein, the stable domain states written into memory elements 71 and 74 are the same, and are opposite to the domain states written into memory elements 72 and 73.

For illustrative purposes, it can be assumed that the presence of a cross-tie, Bloch-line pair in memory elements 71 and 74, accompanied by the presence of a non-inverted Neel wall domain state in memory elements 72 and 73, corresponds to a stored logic level of "1". To switch the domain states in each of the four memory elements to the alternate stable domain state, thereby writing a "0" into the set of four memory elements, the direction of the currents flowing in row conductors 50A and 50B and write conductor portions 56A and 56B is respectively switched by row address means 44 and column address means 42.

In accordance with this further aspect of the invention, the preferred method for reading a single bit of data out from the four memory elements without applying current pulses at least two different times during the read sequence will now be described. A single small amplitude current pulse in the same direction (e.g., left to right) is applied to row conductors 50A and 50B. At the same time, a single nominal current pulse is applied to column conductors 48A and 48C, and to column conductors 48B and 48D, to generate tap voltages related to the magnetoresistance of the corresponding memory elements. In the example shown, the first and second column conductors are connected with first connecting conductor 57E, so that the applied current necessarily flows in opposite directions in column conductors 48A and 48B. Column conductors 48A and 48B contain memory elements 71 and 72, which are located in different rows, so the two memory elements connected in a single circuit by first connecting conductor 57E are in different domain states. The operation with respect to column conductors 48C and 48D containing memory elements 73 and 74, which are connected in a circuit by second connecting conductor 57F, is completely analogous to that described above. The read function is accomplished by detecting the change in magnetoresistance in the memory elements to the flow of a non-destructive read current in column conductors 48 in response to the applying of a current pulse to overlying row conductors.

As shown in FIG. 2, when an external magnetic field is applied, the voltage drop across a memory element storing a cross-tie, Bloch-line pair domain state will be greater than the voltage drop across a memory element storing a non-inverted Neel wall domain state. For example, if a logic level "1" is stored in the set of four memory elements (and corresponds to cross-tie, Bloch-line pair domain states being stored in memory elements 71 and 74 underneath first row conductor 50A), then the voltage drop across memory elements 71 and 74 will exceed the voltage drop across memory elements 72 and 73. If the current applied to column conductors 48A and 48B first flows, for example, through memory element 71, which is storing a cross-tie, Bloch-line pair, the tap voltages 57A and 57B at first connecting conductor 57E for this example will be relatively small. In contrast, the tap voltages 57C and 57D at second connecting conductor 57F will be relatively large if the applied current first flows through a memory element in a different row, i.e., memory element 73 underlying row conductor 50B, and the voltage drop across this memory element (which is in a non-inverted Neel wall domain state) is smaller than that across memory elements 71 and 74. The tap voltages at the first and second connecting conductors are inputted to the first and second inputs of differential amplifier 75. The voltage at the first input will be smaller than the voltage at the second input for this example. Therefore, a differential input voltage exists at amplifier 75 that allows the level of the data stored in the four memory elements to be read out in accordance with the voltage output of amplifier 75. If a logic level "0" were stored in the set of four memory elements (and corresponded to cross-tie, Bloch-line pair domain states being stored in memory elements 72 and 73), then the tap voltages 57C and 57D at second connecting conductor 57F would be smaller than the tap voltages at first connecting conductor 57E, and the voltage output of differential amplifier 75 would change. Each connecting conductor acts as a center tap for detecting a difference in magnetoresistance for two complementary memory elements storing opposite stable domain states.

Figure 8:
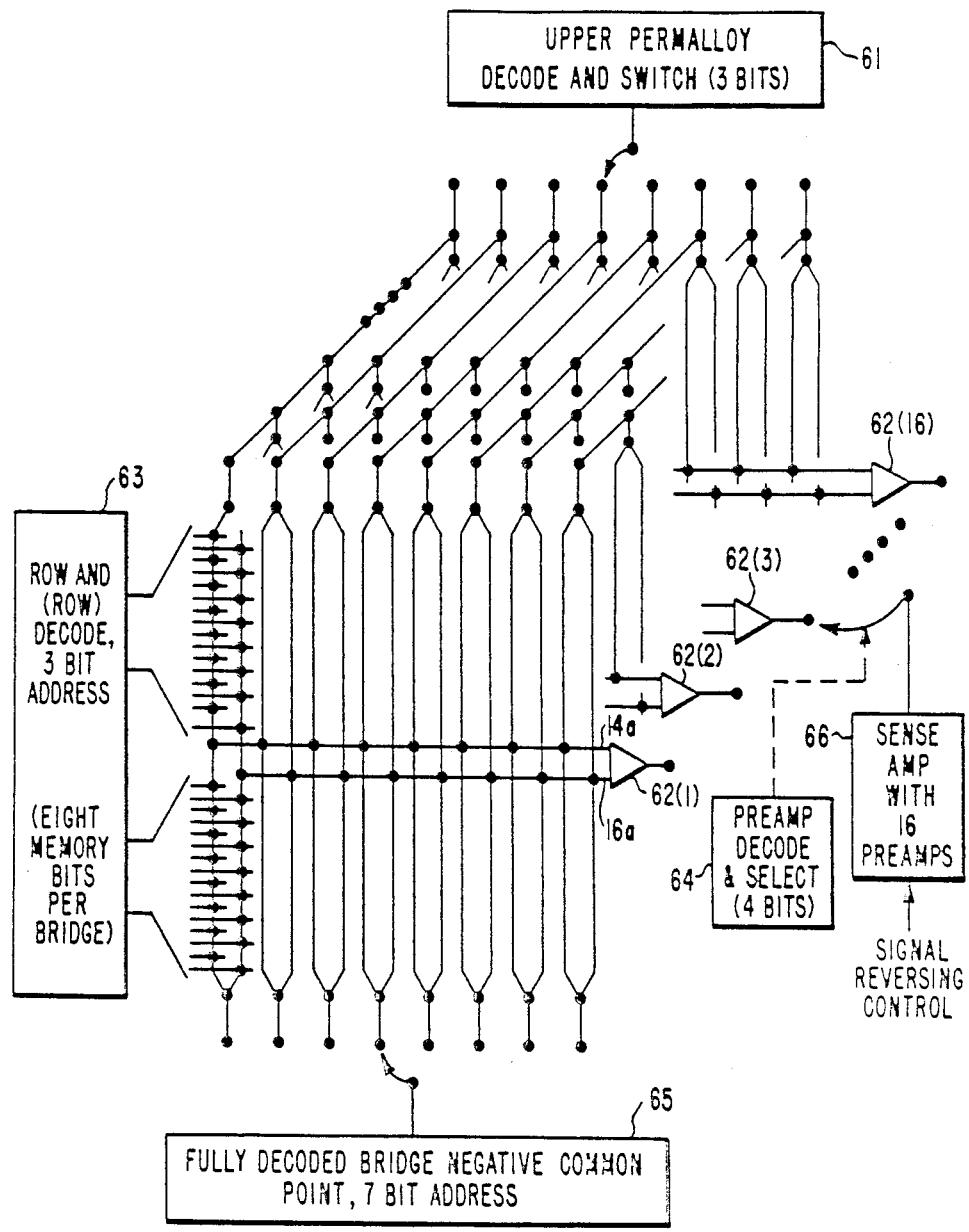
FIG. 8 is a schematic of the addressing of column and row conductors.

FIG. 8 is a representation of a 1,024 bit random access memory chip. In this representation, the memory array comprises 8×16 bridges for a total of 128 bridges, each with eight memory elements aligned along Permalloy columns 48 of the bridges. A cell consisting of four memory elements is used to store a single digital bit. In FIG. 8, the tap voltages are output from the memory array along one of 16 pairs of differential lines, such as 14A and 16A, to one of 16 preamps 62, which are selected by preamp decode and select means 64 for connection to sense amplifier 66. Within each bridge, eight binary digits are stored in eight memory elements arranged in series in each of four legs of the bridge. The selection of only one bit out of eight for each bridge is achieved using the unique three-bit address of the pair of row conductors 50 overlying the corresponding four memory elements. The row and decode means 63 is coupled to row conductors 50. For column 48 selection, a two-dimensional matrix selects a particular bridge including four columns 48, without any interaction with the other bridges. The 16 groups of eight bridges eliminate the need to duplicate the same number of large highcurrent switches for each group of bridges at the positive common point of the bridge. As seen in FIG. 8, only three bits of decoding and eight large current switches are needed for the positive common points of the bridges. In the FIG. 8 embodiment, the column decode and switch means 61 is coupled to the upper end of the bridges. The 128 bridges are fully decoded at the negative common point of the bridge. The lower end of the bridges is coupled to the decoded bridge means 65. Choosing one out of sixteen pre-amps 62(1)-62(16) with preamp decode and select means 64 specifies the remaining four bits (out of seven) to fully select one bridge out of 128 for readout. A signal reversing control signal is applied to sense.amplifier 66. The signal reversing control signal permits current reversal through the memory elements during the read operation and eliminates the need to duplicate large current switches in the column address means for reading the memory elements. The signal reversing means is seen in greater detail in the schematic of FIG. 9.

Figure 9:
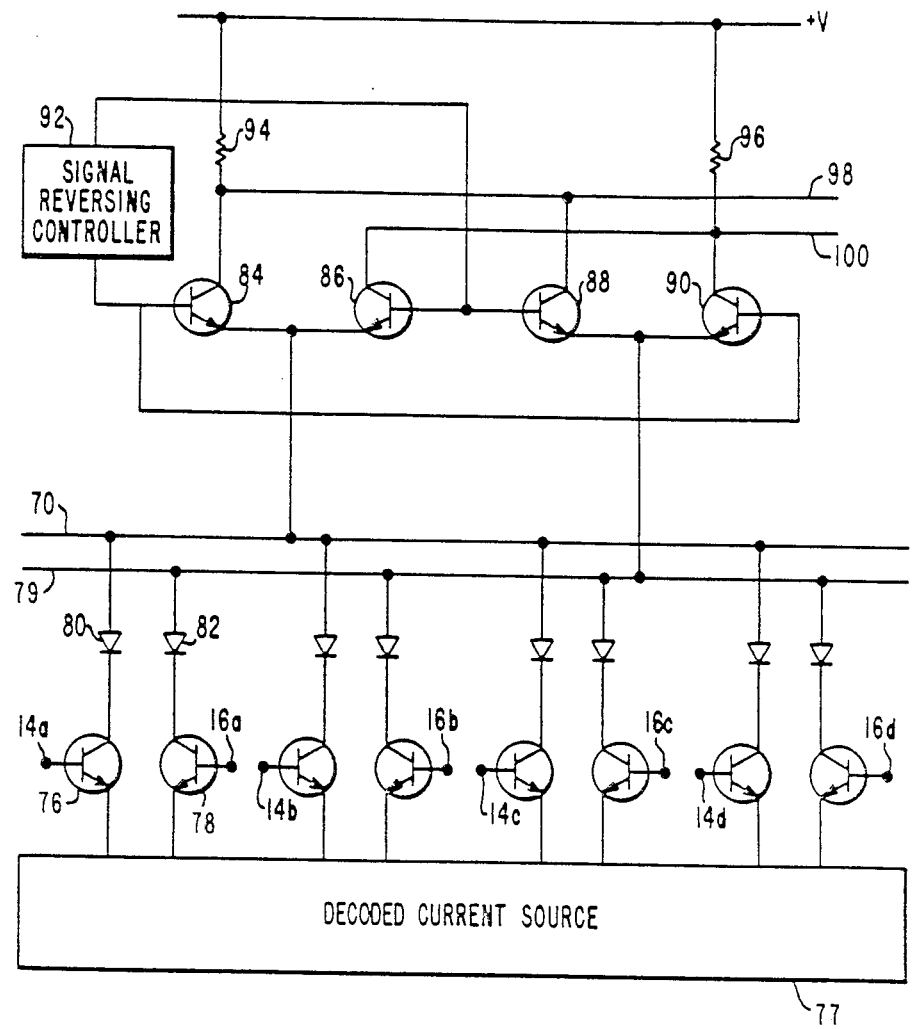
FIG. 9 is a schematic of a signal reversing control.

In FIG. 9, the output of one of the sixteen preamps 62, such as 62(1), is applied to lines 70 and 79. In the preferred embodiment, lines 70 and 79 are respectively connected to the outputs of four of the sixteen preamps. The differential input lines 14a and 16a for preamp 62(1) are connected to the base of transistors 76 and 78. The emitters of transistors 76 and 78 are connected to decoded current source 77, and the collectors of transistors 76 and 78 are connected respectively to diodes 80 and 82, which are connected to output lines 70 and 79. Three of the other sixteen preamps 62 are connected to lines 70 and 79 in similar fashion. The diodes connected to the transistor collector nodes in part provide for total isolation of the selected memory bridge from all other bridges that are not selected for reading. Lines 70 and 79 are also connected respectively to the emitters of steering transistors 84 and 86, and 88 and 90. The bases of transistors 84 and 90 are connected in common to one side of the signal reversing controller 92, while the bases of transistors 86 and 88 are connected in common to the other side of signal reversing controller 92. The collectors of transistors 84 and 88 are commonly connected to resistor 94, which is connected to a potential +V, while the collectors of transistors 86 and 90 are commonly connected to resistor 96 which is also connected to the potential +V.

The two pairs (84 and 86, 88 and 90) of steering transistors serve to steer differential currents from the selected preamp (and bridge) into matching load resistors 94 and 96. A current mode signal of one logic level applied to the steering transistors is associated with input 14a being non-inverting. The current mode signal of opposite logic level reverses the currents into the load resistors, and is associated with input node 14a being inverting. The signal reversing control with the most positive bias functions as a pseudo power supply/bias source, causing the transistors which it activates to behave like grounded base stages, thereby speeding settling of the circuit. The reversible signal output is on lines 98 and 100. The column buses, unlike the bridges, are not interconnected via sensing preamps 62, so choosing one column out of 128 involves three bits of address at the positive supply and the remaining four bits at the negative supply, thereby resulting in a tremendous saving in the number of large high current switching transistors. (See FIG. 8.) The sense amplifier means 66 can include the correlated double sampling signal processing system 11 used in the embodiment of FIG. 1.

Figure 10:
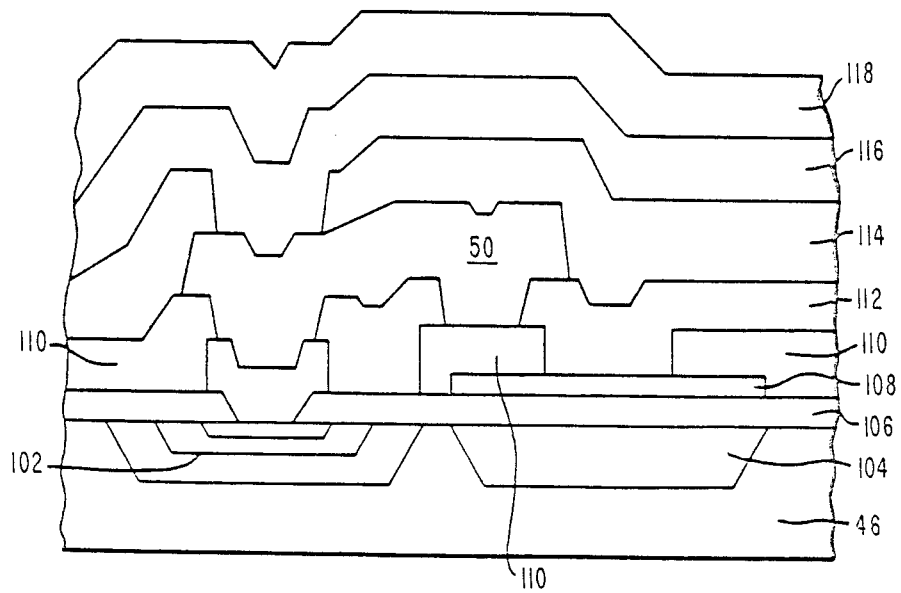
FIG. 10 is a cross-section of a cross-tie random access memory implemented on a semiconductor substrate.

FIG. 10 is a cross-section representation of how the 1K cross-tie random access memory can be implemented in a monolithic fashion upon a semiconductor substrate 46 with a transistor 102 and a semiconductor tub 104 provided beneath a first dielectric layer 106 and a thin magnetoresistive film 108. A low resistance contact layer 110 is disposed over dielectric 106 and magnetoresistive layer 108 to make electrical contact to layer 108, as well as functioning as an etch stop, a low resistance magnetoresistive layer interconnect/shunt, and a transistor contact layer. A second dielectric layer 112 is disposed atop magnetoresistive layer 108. Row conductor 50 is disposed in part over dielectric layer 112 and is aligned in part over magnetoresistive film 108. A third dielectric layer 114 is disposed atop row conductor 50, and a conductor 116 is disposed atop third dielectric layer 114. A scratch protection dielectric 118 is disposed over the entire chip area, except for the bonding pad region.

It will be further apparent to those skilled in the art that various modifications and variations can be made to the system of the instant invention, without departing from the scope or spirit of the invention, and it is intended that the present invention cover the modifications and variations of the system, provided that they come within the scope of the appended claims and their equivalents.

We claim as our invention:

1. A magnetoresistive random access cross-tie memory array comprising:

a. an insulating substrate;

b. a plurality of spaced columns of thin film magnetoresistive material disposed upon said substrate, said thin film columns being symmetrically patterned and shaped to provide only two stable magnetic domain states at spaced memory elements which form and X-Y array of spaced-apart memory elements magnetically addressable to one of two possible stable states;

c. row conductors aligned over row-aligned pairs of memory elements;

d. serpentine-shaped column conductors having column-extending portions interconnecting row-aligned extending portions, each said serpentine-shaped column conductor arranged so that adjacent row-aligned extending portions of said column conductor conduct current in opposed directions over row-adjacent memory elements;

e. a single binary digit being written and stored at four of said memory elements defined on four adjacent columns of magnetoresistive material, with one memory element of the four being located along each of said four columns of magnetoresistive material, with two of said four memory elements aligned under a first row conductor, and the other two memory elements aligned under a second row conductor;

f. said four memory elements being aligned under one of said serpentine column conductors, with two of said four memory elements aligned under said first row conductor being further aligned under a first row-aligned extending portion of said one serpentine column conductor, and the other two of said four memory elements aligned under said second row conductor being further aligned under a second row-aligned extending portion of said one serpentine column conductor; and g. wherein signals passed through said first and second row-aligned extending portions of said one serpentine column conductor are complementary signals.

2. The cross-tie random access memory array system set forth in claim 1, wherein the single binary digit is written and stored at the four memory elements by applying a half address signal to the serpentine column conductor, while simultaneously applying complementary half address signals to the first and second row conductors.

3. The cross-tie random access memory array system set forth in claim 1, wherein the single binary digit is read out by applying a read signal to the selected column of magnetoresistive material while applying a half address read signal to the selected row conductor to effect a change of resistance at the selected memory element as a function of the applied magnetic field, which magnetoresistive effect is detectable to identify one of two stable magnetic domain states which represent the binary data.

4. A cross-tie random access memory, in which a single bit of data is stored in a memory element by alternately generating and annihilating a cross-tie, Bloch-line pair in the memory element, comprising:

a plurality of column conductors, each column conductor including a plurality of memory elements and a tap point;

a plurality of row conductors, each row conductor overlying a plurality of memory elements;

column address means for applying a column current to a selected column conductor including a selected memory element, for generating a tap voltage at the tap point of the selected column conductor that is related to the magnetoresistance of the selected memory element;

data signal means coupled to the tap point of the selected column conductor for generating a data signal voltage related to the tap voltage at times when the column current is applied to the selected column conductor;

row address means for applying a row current to a selected row conductor overlying the selected memory element for applying a magnetic field to the selected memory element;

offset means coupled to the data signal means for storing a first data signal voltage present at a time when the column current is applied and the row current is not applied, and for comparing the first data signal voltage with a second data signal voltage present at a subsequent time when both the column current and row current are applied, to generate a difference voltage related to the difference between the first and second data signal voltages; and output means coupled to the offset means and responsive to the difference voltage for generating a digital output corresponding to the data bit stored in the selected memory element.

5. A cross-tie random access memory in accordance with claim 4 in which:

the plurality of column conductors includes four column conductors, each including one of a set of four memory elements in which a single bit of data is stored, the four memory elements including a first row-aligned pair of memory elements and a complementary second row-aligned pair of memory elements;

the plurality of row conductors includes a first and a second row conductor respectively overlying the first and second row-aligned pairs of memory elements;

the row address means simultaneously applies a first row current to the first row conductor and a second row current to the second row conductor, at times when the data bit is read; and the column address means simultaneously applies a column current to each of the four column conductors at times when the data bit is read.

6. A cross-tie random access memory in accordance with claim 5 wherein:

the four column conductors include a first and a second column conductor having the first row-aligned pair of memory elements and a third and a fourth column conductor having the second row-aligned pair of memory elements;

the first and third column conductors having tap points coupled together;

the second and fourth column conductors having tap points coupled together;

the column address means applies a column current in one direction to the first and fourth column conductors and in the other direction to the second and third column conductors, at times when the data bit is read;

the row address means applies the first and second row currents in the same direction to the first and second row conductors at times when the data bit is read, to apply substantially the same magnetic field to each of the four memory elements;

wherein the tap voltage at the tap points of the first and third column conductors is alternately higher and lower than the tap voltage at the tap points of the second and fourth column conductors in accordance with the data bit stored in the four memory elements.

7. A cross-tie random access memory, in which a single bit of data is stored in a memory element by alternately generating and annihilating a cross-tie, Bloch-line pair in tie memory element, comprising:

a plurality of column conductors, each column conductor including a plurality of memory elements and a tap point;

a plurality of row conductors, each row conductor overlying a plurality of memory elements;

column address means for applying a column current in two different directions at different times to a selected column conductor including a selected memory element, for generating a tap voltage at the tap point of the selected column conductor that is related to the magnetoresistance of the selected memory element;

data signal means coupled to the tap point of the selected column conductor for generating a data signal voltage related to the tap voltage at times when the column current is applied to the selected column conductor;

row address means for applying a row current to a selected row conductor overlying the selected memory element for applying a magnetic field to the selected memory element;

double sampling means coupled to the data signal means for storing a first data signal voltage present at a time when the column current is applied in one direction, and for comparing the first data signal voltage with a second data signal voltage present at a subsequent time when the column current is applied in the other direction, to generate a double sampling voltage related to the difference between the first and second data signal voltages; and output means coupled to the double sampling means and responsive to the double sampling voltage for generating a digital output corresponding to the data bit stored in the selected memory element.

8. A cross-tie random access memory in accordance with claim 7 in which:

the plurality of column conductors includes four column conductors, each including one of a set of four memory elements in which a single bit of data is stored, the four memory elements including a first row-aligned pair of memory elements and a complementary second row-aligned pair of memory elements;

the plurality of row conductors includes a first and a second row conductor respectively overlying the first and second row-aligned pairs of memory elements;

the row address means simultaneously applies a first row current to the first row conductor and a second row current to the second row conductor, at times when the data bit is read; and the column address means simultaneously applies a column current to each of the four column conductors at times when the data bit is read.

9. A cross-tie random access memory in accordance with claim 8 wherein:

the four column conductors include a first and a second column conductor having the first row-aligned pair of memory elements and a third and a fourth column conductor having the second row-aligned pair of memory elements;

the first and third column conductors having tap points coupled together;

the second and fourth column conductors having tap points coupled together;

the column address means applies a column current in one direction to the first and fourth column conductors and in the other direction to the second and third column conductors, at times when the data bit is read;

the row address means applies the first and second row currents in the same direction to the first and second row conductors at times when the data bit is read, to apply substantially the same magnetic field to each of the four memory elements;

wherein the tap voltage at the tap points of the first and third column conductors is alternately higher and lower than the tap voltage at the tap points of the second and fourth column conductors in accordance with the data bit stored in the four memory elements.

10. A cross-tie random access memory, in which a single bit of data is stored in a memory element by alternately generating and annihilating a cross-tie, Bloch-line pair in the memory element, comprising:

a plurality of column conductors, each column conductor including a plurality of memory elements and a tap point;

a plurality of row conductors, each row conductor overlying a plurality of memory elements;

column address means for applying a column current in two different directions at different times to a selected column conductor including a selected memory element, for generating a tap voltage at the tap point of the selected column conductor that is related to the magnetoresistance of the selected memory element;

data signal means coupled to the tap point of the selected column conductor for generating a data signal voltage related to the tap voltage at times when the column current is applied to the selected column conductor;

row address means for applying a row current to a selected row conductor overlying the selected memory element for applying a magnetic field to the selected memory element;

offset means coupled to the data signal means for storing a first data signal voltage present at a time when the column current is applied and the row current is not applied, and for comparing the first data signal voltage with a second data signal voltage present at a subsequent time when both the column current and row current are applied, to generate a difference voltage related to the difference between the first and second data signal voltages;

double sampling means coupled to the offset means for storing a first difference voltage present at a time when the column current is applied in one direction, and for comparing the first difference offset voltage with a second difference voltage present at a subsequent time when the column current is applied in the other direction, to generate an output voltage related to the difference between the first and second difference voltages; and output means coupled to the double sampling means, and responsive to the output voltage, for generating a digital output corresponding to the data bit stored in the selected memory element.

11. A cross-tie random access memory in accordance with claim 10, in which:

the plurality of column conductors includes four column conductors, each including one of a set of four memory elements in which a single bit of data is stored, the four memory elements including a first row-aligned pair of memory elements and a complementary second row-aligned pair of memory elements;

the plurality of row conductors includes a first and a second row conductor respectively overlying the first and second row-aligned pairs of memory elements;

the row address means applies a first row current to the first row conductor and a second row current to the second row conductor, at times when the data bit is read; and the column address means simultaneously applies a column current to each of the four column conductors at times when the data bit is read.

12. A cross-tie random access memory in accordance with claim 11 wherein:

the four column conductors include a first and a second column conductor having the first row-aligned pair of memory elements and a third and a fourth column conductor having the second row-aligned pair of memory elements;

the first and third column conductors having tap points coupled together;

the second and fourth column conductors having tap points coupled together;

the column address means applies a column current in one direction to the first and fourth column conductors and in the other direction to the second and third column conductors, at times when the data bit is read;

the row address means simultaneously applies the first and second row currents in the same direction to the first and second row conductors at times when the data bit is read, to apply substantially the same magnetic field to each of the four memory elements;

wherein the tap voltage at the tap points of the first and third column conductors is alternately higher and lower than the tap voltage at the tap points of the second and fourth column conductors in accordance with the data bit stored in the four memory elements.

13. A cross-tie random access memory, in which a single bit of data is stored in a set of four memory elements, including a first row-aligned pair of memory elements and a complementary second row-aligned pair of memory elements, comprising:

four column conductors, each including a plurality of column-aligned memory elements and a tap point, and each including one of the four memory elements;

a first and second row conductor, each overlying a plurality of row-aligned memory elements, and respectively overlying the first and second row-aligned pairs of memory elements;

a write conductor overlying a plurality of memory elements, and including a first and second portion respectively overlying the first and second row-aligned pairs of memory elements, to which a write current is applied at times when the bit of data is written, for generating a cross-tie, Bloch-line pair in one row-aligned pair of memory elements and annihilating a cross-tie, Bloch-line in the other row-aligned pair of memory elements;

row address means for applying a first row current to the first row conductor and a second row current to the second row conductor at times when the bit of data is read and at times when the bit of data is written, for applying a magnetic field to the first and second row-aligned pairs of memory elements;

column address means for applying the write current to the first and second portions of the write conductor at times when the bit of data is written to apply a magnetic field to the first and second row-aligned pairs of memory elements, and for applying a read current to each of the four column conductors at times when the bit of data is read to generate a tap voltage at the tap point of each of the four column conductors that is related to the magnetoresistance of each of the four memory elements; and data signal means coupled to the tap points of the four column conductors for generating a data signal voltage related to the tap voltages at times when the read current is applied that corresponds to the data bit stored in the four memory elements.

14. A cross-tie random access memory in accordance with claim 13 wherein:

the four column conductors include a first and a second column conductor having the first row-aligned pair of memory elements and a third and a fourth column conductor having the second row-aligned pair of memory elements;

the first and third column conductors having tap points coupled together;

the second and fourth column conductors having tap points coupled together;

the column address means applies a column current in one direction to the first and fourth column conductors and in the other direction to the second and third column conductors, at times when the data bit is read;

the row address means applies the first and second row currents in the same direction to the first and second row conductors at times when the data bit is read, to apply substantially the same magnetic field to each of the four memory elements;

wherein the tap voltage at the tap points of the first and third column conductors is alternately higher and lower than the tap voltage at the tap points of the second and fourth column conductors in accordance with the data bit stored in the four memory elements.

15. A cross-tie random access memory in accordance with claim 14, in which:

the row address means applies the first and second row currents in different directions to the first and second row conductors, at times when the data bit is written, to apply a first magnetic field to one row-aligned pair of memory elements and a second magnetic field to the other row-aligned pair of memory elements;

the write conductor is arranged in a manner that causes the write current to flow in different directions through the first and second portions, to apply a third magnetic field to the one row-aligned pair of memory elements and a fourth magnetic field to the other row-aligned pair of memory elements;

wherein the applying of the first and third magnetic fields generates a cross-tie, Bloch-line pair in the one row-aligned pair of memory elements, and the applying of the second and fourth magnetic fields annihilates a cross-tie, Bloch-line pair in the other row-aligned pair of memory elements, at times when the data bit is written into the four memory elements.

16. A method for reading data out from a cross-tie random access memory, in which four memory elements used to store a single bit of data are each included in one of four column conductors, the four memory elements including a first row-aligned pair included in a first and fourth column conductor and underlying a first row conductor, and a complementary second row-aligned pair included in a second and third column conductor and underlying a second row conductor, in which each column conductor includes a tap point, the method comprising the steps of:

applying a single current pulse to the first and the second row conductor in the same direction, to apply substantially the same magnetic field to each of the four memory elements;

applying a single current pulse to the four column conductors, to generate a tap voltage at the tap point of each of the four column conductors that is related to the magnetoresistance of each of the four memory elements;

wherein the tap voltages for the first and second column conductors increase at times when the four memory elements are storing a data bit at one level and decrease at times when the four memory elements are storing a data bit at another level, and the tap voltages for the third and fourth column conductors decrease at times when the four memory elements are storing a data bit at the one level and increase at times when the four memory elements are storing a data bit at the other level;

inputting the tap voltages for the first and second column conductors to a first input of a differential amplifier;

inputting the tap voltages for the third and fourth column conductors to a second input of the differential amplifier; and reading out the level of the data bit stored in the four memory elements in accordance with a voltage output generated by the differential amplifier.

17. A method for writing data into and reading data out from a cross-tie random access memory, in which four memory elements used to store a single bit of data are each included in one of four column conductors, the four memory elements including a first row-aligned pair included in a first and fourth column conductor and underlying a first row conductor, and a complementary second row-aligned pair included in a second and third column conductor and underlying a second row conductor, in which each column conductor includes a tap point, the method comprising the steps of:

applying a single current pulse to the first row conductor in one direction to apply a first magnetic field to the first row-aligned pair;

applying a single current pulse to the second row conductor in another direction to apply a second magnetic field to the second row-aligned pair;

applying a single current pulse to a write conductor including a first and second portion respectively overlying overlying the first and second row-aligned pairs and arranged in a manner that causes the write current to flow in different directions through the first and second portions, to apply a third magnetic field to the first row-aligned pair of memory elements and a fourth magnetic field to the second row-aligned pair of memory elements;

wherein the first and third magnetic fields are sufficient to write data into the two memory elements of the first row-aligned pair by generating cross-tie, Bloh-line pairs in the two memory elements; and wherein the second and fourth magnetic fields are sufficient to write data into the two memory elements of the second row-aligned pair by annihilating any cross-tie, Bloch-line pairs in the two memory elements;

wherein the above steps occur during writing of data into the set of four memory elements;

applying a single current pulse to the first and the second row conductor in the same direction, to apply substantially the same magnetic field to each of the four memory elements;

applying a single current pulse to the four column conductors, to generate a tap voltage at the tap point of each of the four column conductors that is related to the magnetoresistance of one of the four memory elements;

wherein the tap voltages for the first and second column conductors increase at times when the four memory elements are storing a data bit at one level and decrease at times when the four memory elements are storing a data bit at another level, and the tap voltages for the third and fourth column conductors decrease at times when the four memory elements are storing a data bit at the one level and increase at times when the four memory elements are storing a data bit at the other level;

inputting the tap voltages for the first and second column conductors to a first input of a differential amplifier;

inputting the tap voltages for the third and fourth column conductors to a second input of the differential amplifier; and reading out the level of the data bit stored in the four memory elements in accordance with a voltage output generated by the differential amplifier;

wherein the above six steps occur during reading of data from the set of four memory elements.

* * * * *